(12) United States Patent
Choi et al.

(10) Patent No.: US 7,332,691 B2
(45) Date of Patent: Feb. 19, 2008

(54) COOLING PLATE, BAKE UNIT, AND SUBSTRATE TREATING APPARATUS

(75) Inventors: Jin-Young Choi, Cheonan (KR); Jun-Ho Ham, Cheonan (KR); Tae-Su Kim, Cheonan (KR); Dong-Beop Lee, Cheonan (KR)

(73) Assignee: Semes Co., Ltd., Chonan-Shi (KR)

( * ) Notice: Subject to any disclaimer, the term of this patent is extended or adjusted under 35 U.S.C. 154(b) by 133 days.

(21) Appl. No.: 11/274,202

(22) Filed: Nov. 16, 2005

(65) Prior Publication Data

US 2007/0090520 A1 Apr. 26, 2007

(30) Foreign Application Priority Data

Oct. 25, 2005 (KR) .................. 10-2005-0100852

(51) Int. Cl.
*F27B 5/14* (2006.01)
*A21B 2/00* (2006.01)

(52) U.S. Cl. .................. 219/390; 219/405; 219/411; 118/724; 118/725; 118/50.1; 392/416; 392/418

(58) Field of Classification Search ................. 219/390, 219/405, 411; 392/416, 418; 118/724–5, 118/728–9
See application file for complete search history.

(56) References Cited

U.S. PATENT DOCUMENTS 6,062,852 A * 5/2000 Kawamoto et al. ......... 432/258

FOREIGN PATENT DOCUMENTS

| JP | 09-148417 | 6/1997 |
| KR | 10-1998-079555 | 11/1998 |
| KR | 10-2006-0082486 | 7/2006 |

OTHER PUBLICATIONS

Korean Office Action dated Sep. 27, 2006 with English translation.

* cited by examiner

*Primary Examiner*—Shawntina Fuqua
(74) *Attorney, Agent, or Firm*—Harness, Dickey & Pierce, P.L.C.

(57) ABSTRACT

A bake unit includes a cooling plate for cooling a substrate and a lift pin assembly for loading a substrate on the cooling plate. When a wafer is cooled on the cooling plate, a guide groove is formed at the cooling plate to allow a space between the wafer and the cooling plate to communicate with the exterior. Thus, an inner pressure of the space is maintained to be equal to an outer pressure thereof.

21 Claims, 6 Drawing Sheets

COOLING PLATE, BAKE UNIT, AND SUBSTRATE TREATING APPARATUS

PRIORITY STATEMENT

This application claims priority of Korean Patent Application No. 2005-100852, filed on Oct. 25, 2005 in the Korean Intellectual Property Office, the disclosure of which is incorporated herein in its entirety by reference.

BACKGROUND OF THE INVENTION

1. Field of the Invention

The present invention relates to an apparatus used in the manufacturing of integrated circuits (ICs) and, more particularly, to a bake unit for heating or cooling substrates.

2. Description of Related Art

As the integration density of semiconductor devices has increased in recent years, unit areas of cells become smaller and circuit linewidths become finer. Therefore, photolithography is increasingly becoming significant.

Photolithography includes deposit, expose, develop, and bake processes. The bake process is a process for heating or cooling substrates at a determined temperature, which is performed before or after each of these processes is performed. The bake process includes a heating step in which substrates are heated by means of a heating plate and a cooling step in which substrates are cooled by means of a cooling plate. Generally, the cooling step is followed by the heating step.

A bake apparatus for performing a cooling step includes a cooling plate to cool substrates. A substrate is loaded on the cooling plate by means of a lift pin. When the substrate is cooled on the cooling plate, it faces convexly upward. When a substrate heated by means of a heat plate is loaded on the cooling plate, a temperature of air in a space between the cooling plate and the substrate is high. As a cooling step is performed, the temperature of the air drops. Thus, the air is compressed and an inner pressure of the space becomes vacuum or lower than an outer pressure thereof. When the lift pin lifts up the substrate after the cooling step is completed, a strong force is applied to the substrate to damage the substrate.

Further, if the lift pin descends when a substrate is loaded on the cooling plate (or heating plate), air remaining in the space between the substrate and the cooling plate (or heating plate) flows to the exterior of the space. However, if the substrate approaches the cooling plate (or heating plate), a flow path of the air remaining in the space becomes narrower to lower a flow rate of the air exhausted to the exterior of the space. For this reason, the substrate may be located out of position due to the air pressure in the space. Such a problem becomes severe with the recent trend toward larger substrate diameter. Although this problem may be solved by reducing a descending speed of the lift pin, there arises another problem that a process time increases.

SUMMARY OF THE INVENTION

Exemplary embodiments of the present invention are directed to a bake unit, a cooling plate, and a substrate treating apparatus. An exemplary embodiment of the present invention provides a bake unit including a plate on which a substrate is loaded; and a temperature control member provided to the plate to heat or cool the substrate loaded on the plate. A guide path is formed at a top surface of the plate for guiding exterior air to a space formed between the substrate and the plate when the substrate is loaded on the plate.

An exemplary embodiment of the present invention provides a cooling plate on which a guide groove is formed to communicate with the exterior of a space offered between a substrate and the cooling plate. The guide groove guides exterior air into the space to prevent an inner pressure of the space from dropping to become lower than an outer pressure thereof due to air compression when the substrate is cooled on the cooling plate.

An exemplary embodiment of the present invention provides a substrate treating apparatus including a plate on which a substrate is loaded; and lift pins for loading a substrate on the plate or lifting up the substrate from the plate. The lift pins moves up and down through pin holes formed in the plate. A guide path is formed on the plate for guiding air in a space between the plate and the substrate to the exterior of the space when the substrate descends by means of the lift pins. The guide path is provided to a top surface of the guide path and has a guide groove extending to an outer sidewall of the plate from a central region thereof.

DETAILED DESCRIPTION OF THE INVENTION

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

Although substrates used in exemplary embodiments are wafers W, they may be another kind of substrates, such as glass substrates, for use in the manufacturing of flat display panels.

Figure 1:
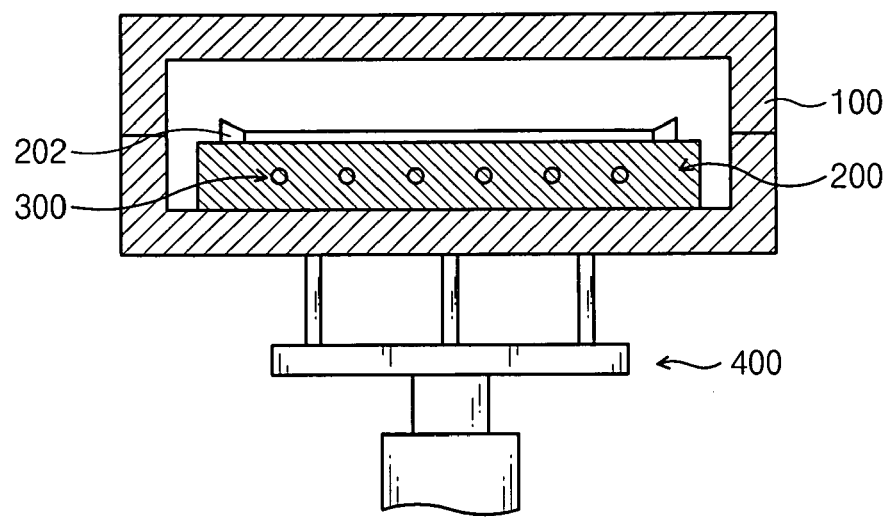
FIG. 1 illustrates a bake unit according to the present invention.
Figure 2:
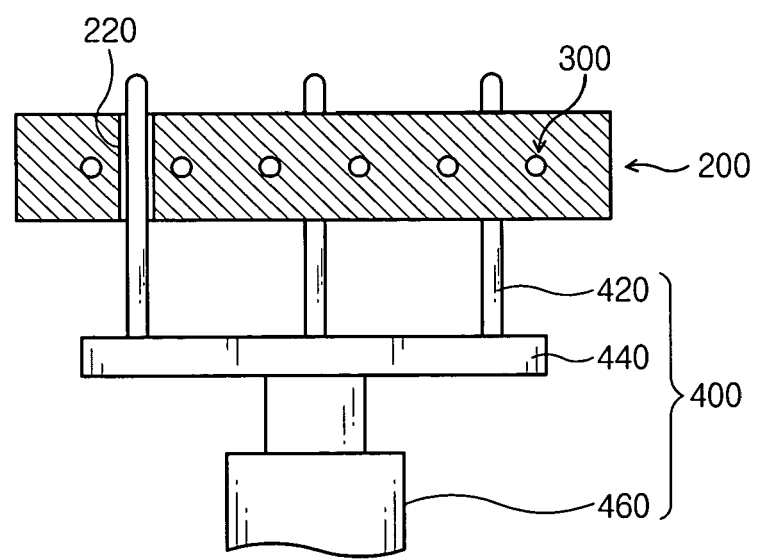
FIG. 2 illustrates a lift pin assembly and a cooling plate of FIG. 1.
Figure 3:
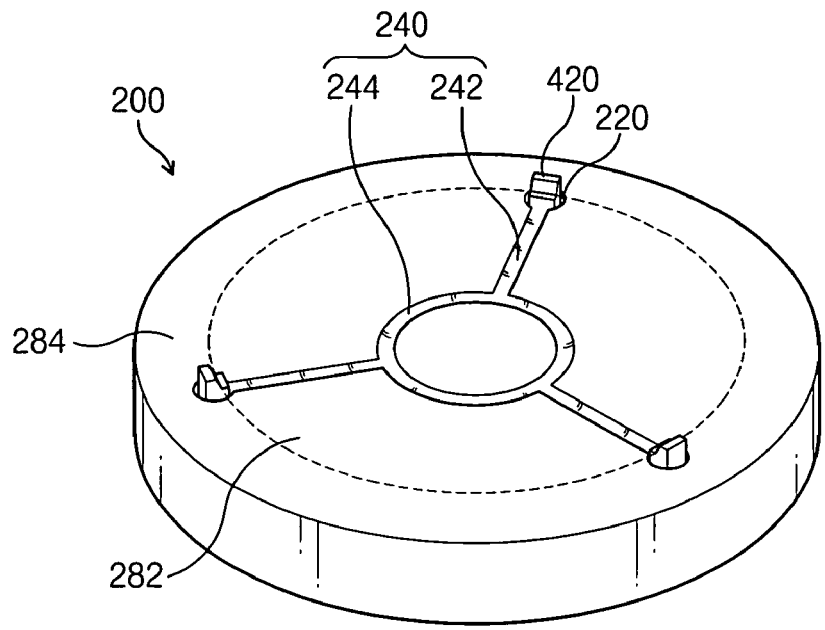
FIG. 3 is a perspective view of the cooling plate illustrated in FIG. 1.

FIG. 1 illustrates a bake unit 1 according to an exemplary embodiment of the present invention, and FIG. 2 illustrates a cooling plate 2 and a lift pin assembly 400 of FIG. 1. FIG. 3 is a perspective view of the cooling plate 200. Referring to FIG. 1, FIG. 2, and FIG. 3, the bake unit 1 includes a chamber 100, a cooling plate 200, a cooling member 300, and a lift pin assembly 400.

The chamber 100 is sealed from the exterior to offer a space in which a process is performed. An opening (not shown) is formed at one sidewall of the chamber 100.

Entrance/exit of wafers is done through the opening. The opening may be opened and closed by a door (not shown).

The cooling plate 200 holds a wafer W during a process and is typically a disc-shaped plate having a larger diameter than the wafer W. The cooling plate 200 includes a central region 282 on which a wafer W is placed during a process and an edge region 284 surrounding the central region 282. Hemispherical ceramic balls (not shown) each having a very small diameter may be mounted at the central region 282 of the cooling plate 200. Guide members 202 may be installed at the edge region 284 of the cooling plate 200 for locating a wafer W at a determined position on the cooling plate 200 and preventing the wafer W from deviating from the determined position. Roughly three to six guide members 202 are provided and may be spaced at regular intervals to surround the wafer W loaded on the cooling plate 200.

The cooling member 300 cools a wafer W loaded on the cooling plate 200 and includes a cooling line formed in the cooling plate 200. Cooling a wafer W may be done by supplying cooling fluid, such as cooling water, to the cooling line.

The lift pin assembly 400 loads a to-be-treated wafer on the cooling plate 200 and lifts a treated wafer from the cooling plate 200. The lift pin assembly 400 includes lift pins 420 contacting a wafer W and a base 440 coupled with the bottom of the respective lift pins 420. The base 440 of the lift pin assembly 400 moves up and down by means of a driver 460. There may be provided three lift pins 420.

Pin holes 220 are formed in the cooling plate 200 to penetrate from the upper end of the cooling plate 200 to the lower end thereof. The pins holes 220 are disposed at a boundary between the central region 282 and the edge region 284 of the cooling plate 200. A lift pin 420 is inserted into the respective pin holes 220. There may be provided three pin holes 220 spaced at regular angles of 120 degrees.

Figure 4:
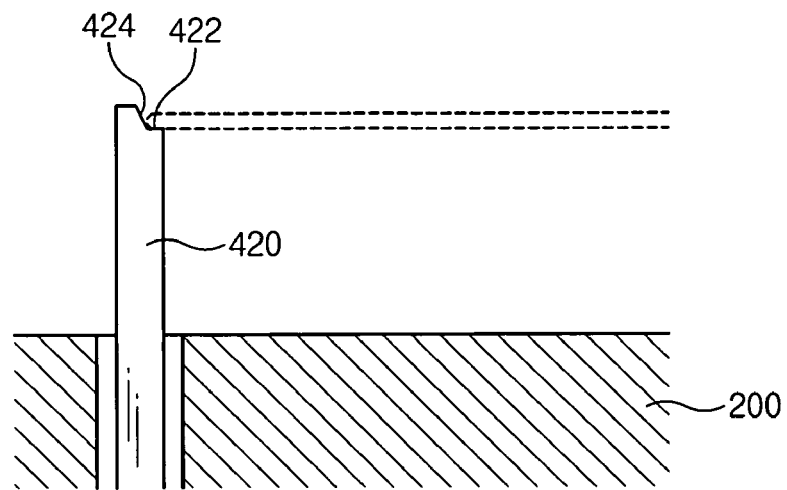
FIG. 4 illustrates a shape of a lift pin.

As illustrated in FIG. 4, the lift pin 420 is a rod-shaped pin having a support surface 422 and a guide surface 424 formed thereon. The support surface 422 contacts the bottom edge end of a wafer W to support the wafer W. The guide surface 424 extends upwardly and downwardly from one outer end of the support surface 422. The guide surface 424 is provided to be perpendicular or angular to the support surface 422. The guide surface 424 comes in close contact with a lateral surface of a wafer W to prevent the wafer W from moving laterally when the lift pin 420 moves.

Returning to FIG. 3, a guide path is formed at the central region 282 of the cooling plate 200. In an exemplary embodiment, the guide path has a guide groove 240 provided to a top surface of the cooling plate 200. While a wafer W is cooled on the cooling plate 200, exterior air flows into a space (204 of FIG. 6) between the wafer W and the cooling plate 200 through the guide groove 240.

Figure 5A:
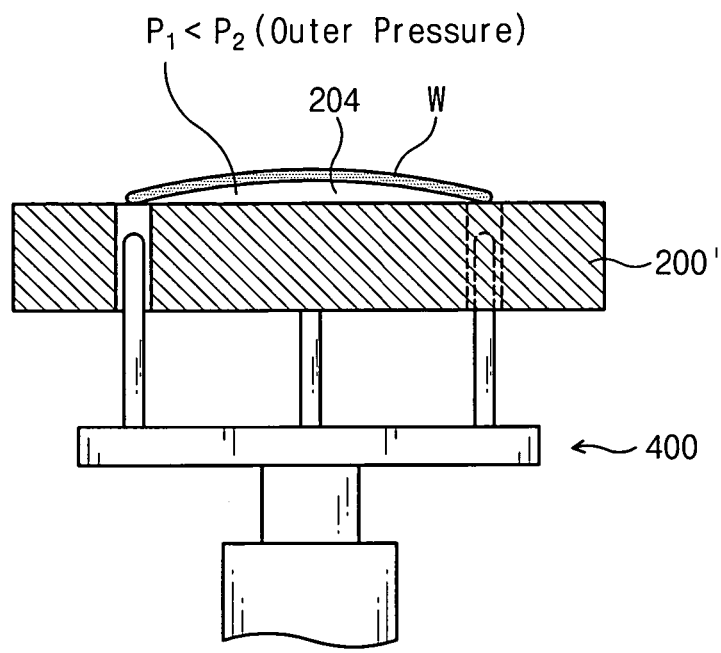
FIG. 5A and FIG. 5B show advantages rendered from the cooling plate according to the present invention.
Figure 5B:
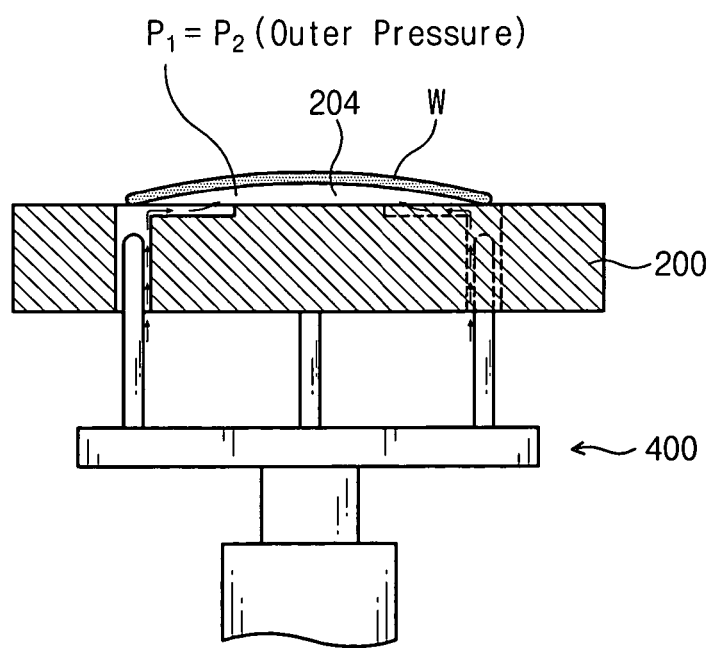

FIG. 5A and FIG. 5B show an inner pressure of a space 204 between a cooling plate 200 and a wafer W when a guide groove 240 is provided or not provided to the cooling plate 200, respectively. In FIG. 5A, a dotted line indicates a path of air flowing into the space 204 between the cooling plate 200 and the wafer W.

As illustrated in FIG. 5A, when a wafer W is loaded on a cooling plate 200' to be cooled, it faces convexly upward. A space 204 is formed between the wafer W and the cooling plate 200'. As the cooling is conducted, an inner temperature of the space 504 drops. Thus, an inner pressure $P_1$ of the space 504 becomes vacuum or lower than an outer pressure $P_2$. When a lift pin 420 lifts up the wafer W from the cooling plate 200 later, a strong force must be applied to the wafer W. Therefore, the wafer W may be damaged by the lift pin 420.

On the other hand, in a case where a guide groove 240 is provided to the cooling plate 200 as illustrated in FIG. 5B, exterior air flows into the foregoing space 204. Therefore, the inner pressure $P_1$ is equal to the outer pressure $P_2$ even after the cooling is conducted. As a result, a lift pin 420 may lift up the wafer W from the cooling plate 200 without applying a strong force to the wafer W.

In an exemplary embodiment, the guide groove 240 includes three linear guide parts 242 and a ring-shaped guide part 244. The linear guide parts 242 extend to the edge region of a cooling plate from the ring-shaped guide part 244 in a radial direction of a wafer. The linear guide parts 242 are spaced at regular intervals.

In an exemplary embodiment, as illustrated in FIG. 3, pin holes 220 are disposed at a boundary between a central region 282 and an edge region 284 and one end of a guide groove 240 extends to the pin hole 220. In this case, a diameter of the pin hole 220 is sufficient to allow exterior air to flow into a space 204 even when a lift pin 420 is inserted.

Figure 6:
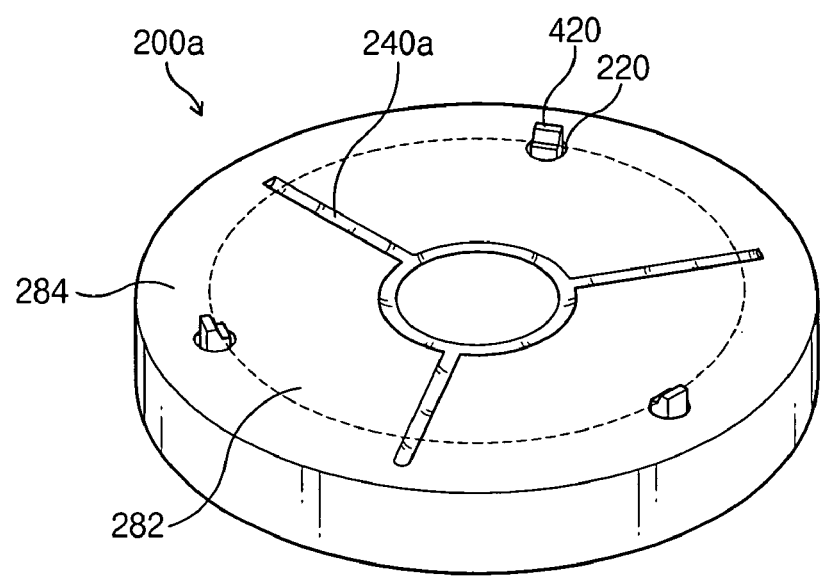
FIG. 6 through FIG. 9 illustrate modified versions of the cooling plate of FIG. 1, respectively.
Figure 7:
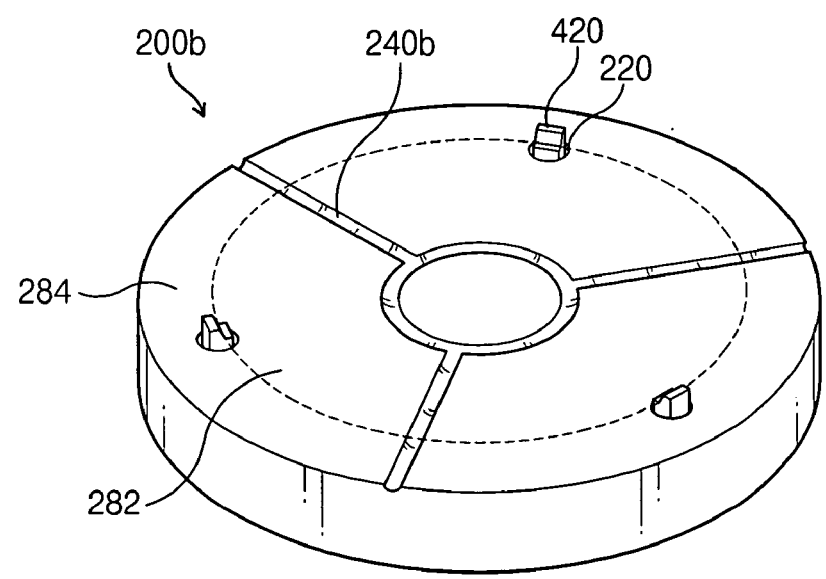

FIG. 6 and FIG. 7 illustrate modified version of a guide groove formed at a cooling plate, respectively. A guide groove 240a extends to the edge region of a cooling plate 240a (see FIG. 6) or an outer sidewall thereof (see FIG. 7).

Figure 8:
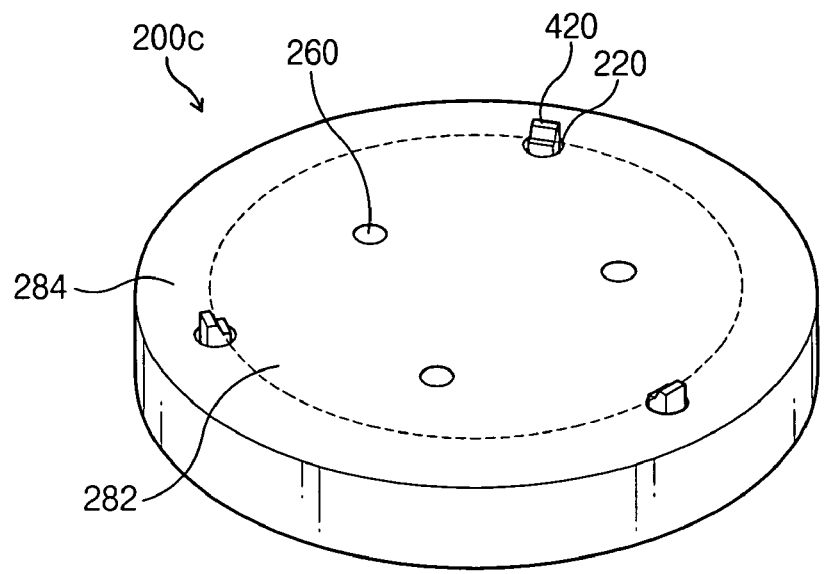
Figure 9:
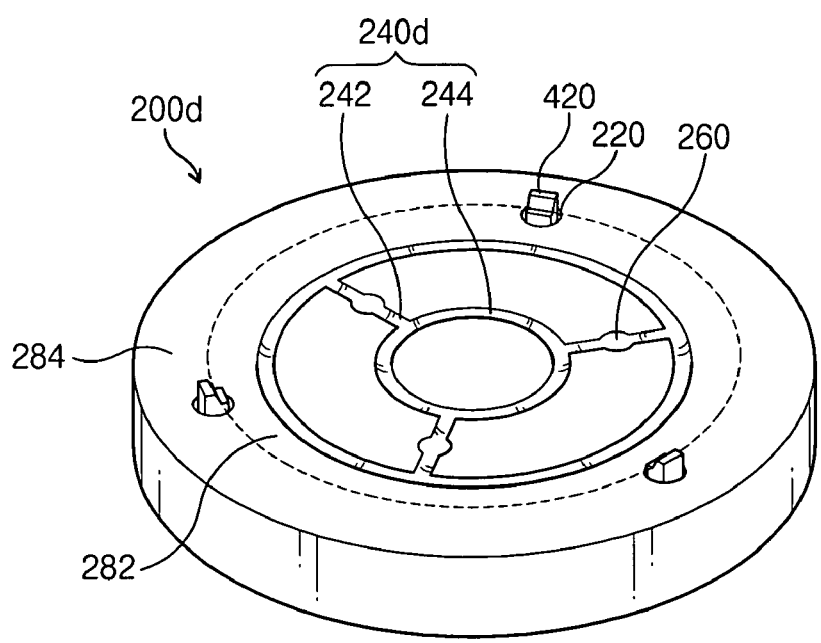

FIG. 8 illustrates a modified version of a guide path. The guide path has three through-hole 260 formed at the central region of a cooling plate 200. Each of the through-holes 260 penetrates from the upper end of the cooling plate 200 to the lower end thereof. Alternatively, a guide groove 240d may be formed at a top surface of a cooling plate 200 to be connected with a through-hole 260, as illustrated in FIG. 9.

Although a guide groove 240 including a linear guide part 242 and a ring-shaped guide part 244 has been described, it is merely exemplary and may have various modified shapes.

Other advantages of the cooling plate according to the invention will now be described with reference to FIG. 10A and FIG. 10B, in which dotted lines indicate a flow of air while a lift pin 420 descends.

Figure 10A:
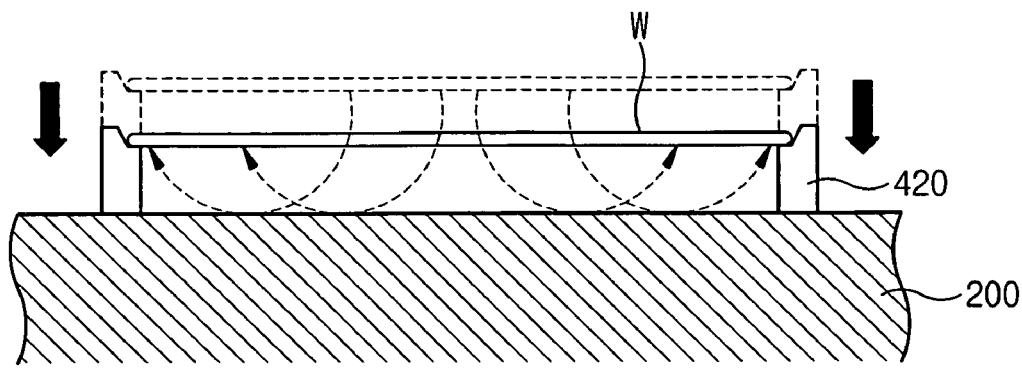
FIG. 10A and FIG. 10B show another advantage rendered from the cooling plate according to the present invention.
Figure 10B:
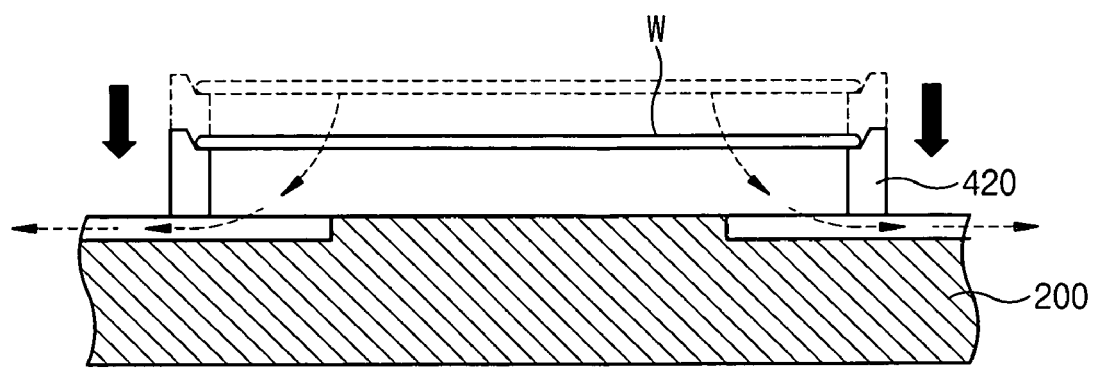

When a lift pin 420 on which a wafer W is placed descends, air of a region below the wafer W is not sufficiently exhausted to the exterior from a space between the wafer W and a cooling plate 200 at a position where the wafer W and the cooling plate 200 are adjacent to each other, as illustrated in FIG. 10A. If the air in the space is not exhausted to the exterior of the space, the wafer W may deviate from a determined position due to an air pressure of the region below the wafer W.

Although a bake unit 1 has been exemplarily described in the foregoing embodiments, the present invention may be applied to various apparatuses each having a configuration for loading a substrate on a plate by means of a lift pin.

The procedure of a process performed at a bake unit according to the invention will now be described in detail.

A wafer W is transferred onto a cooling plate 200 by a transfer arm (not shown). As a lift pin 420 descends, the wafer W is transferred to the lift pin 420 from the transfer arm. A wafer W heated at a high temperature may be transferred to a cooling plate 200. Generally, the heated wafer W has a convex-down shape. As the lift pin 420 descends, the wafer W is loaded on the cooling plate 200. While the lift pin 200 descends, air in a space between the wafer W and the cooling plate 200 partially flows the exterior of the space along a guide groove 240.

When the wafer W is loaded on the cooling plate 200, it is cooled. As the cooling is conducted, the wafer W becomes convex-up. The air remaining in the space between the wafer W and the cooling plate 200 is cooled to lower an inner pressure of the space 204. When exterior air flows into the space 204 through the guide groove 240 due to a pressure difference, the inner pressure of the space 204 is maintained to be equal to the outer pressure thereof. If the process is completed, the lift pin 420 ascends. Afterward, the wafer W is returned to the transfer arm.

As explained so far, when a substrate is cooled at a bake unit, an inner pressure of a space between the substrate and a cooling plate is maintained to be equal to an outer pressure thereof. Therefore, it is possible to prevent a substrate damage caused by a lift pin when the substrate is unloaded from the cooling plate by means of the lift pin. Moreover, it is possible to prevent a descending substrate from deviating from a determined position when the substrate is loaded on the cooling plate by means of the lift pin, Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. A bake unit used in the manufacturing of integrated circuits (ICs), comprising:
    a plate on which a substrate is loaded; and
    a temperature control member provided to the plate to heat or cool the substrate loaded on the plate,
    wherein a guide path is formed at a top surface of the plate for guiding exterior air to a space formed between the substrate and the plate when the substrate is loaded on the plate;
    wherein a pin path is formed in the plate and is configured to accommodate lift pins, and
    wherein the guide path and the pin path are not coextensive.

2. The bake unit of claim 1, wherein the temperature control member is a cooling member for cooling the substrate.

3. The bake unit of claim 2, further comprising:
    the lift pins for loading a substrate on the plate or lifting the substrate from the plate while moving up and down,
    wherein the pin path includes pin holes formed in the plate as moving paths of the lift pins; and
    wherein the lift pin comprises:
    a support surface for supporting the bottom edge of a substrate; and a guide surface opposed to a lateral pan of a substrate placed on the support surface to prevent a substrate loaded on the lift pin from moving laterally.

4. The bake unit of claim 3, wherein a top surface of the plate has a central region on which a substrate is loaded and an edge region surrounding the central region;
    wherein the pin holes are formed at a boundary of the central region and the edge region; and wherein the guide path comprises a guide groove that is connected to the pin hole and extends to the central region.

5. The bake unit of claim 1, wherein the plate has a central region on which a substrate is loaded and an edge region surrounding the central region; and
    wherein the guide path comprises a guide groove extending from the central region to the edge region.

6. The bake unit of claim 1, wherein the plate has a central region on which a substrate is loaded and an edge region surrounding the central region; and
    wherein the guide path comprises a guide groove extending from the central region to an outer sidewall of the plate.

7. The bake unit of claim 3, wherein a top surface of the plate has a central region on which a substrate is loaded and an edge region surrounding the central region;
    wherein the pin holes are formed at a boundary of the central region and the edge region; and
    wherein the guide path comprises through-holes formed at the central region of the plate to penetrate from the upper end of the plate to the lower end thereof.

8. The bake unit of claim 7, wherein the guide path further comprises a guide groove formed at a top surface of the plate to be connected with the through-hole.

9. A bake unit used in the manufacturing of integrated circuits (ICs), comprising:
    a plate on which a substrate is loaded; and
    a temperature control member provided to the plate to heat or cool the substrate loaded on the plate,
    wherein a guide path is formed at a top surface of the plate for guiding exterior air to a space formed between the substrate and the plate when the substrate is loaded on the plate,
    wherein the guide path further comprises a guide groove formed on the plate, the guide groove; including the following,
    a plurality of linear guide parts provided in a radial direction of the plate, and
    at least one ring-shaped guide part provided to be connected with the guide parts, respectively.

10. A cooling plate on which a guide groove is formed to communicate with the exterior of a space offered between a substrate and the cooling plate, the guide groove guiding exterior air into the space to prevent an inner pressure of the space from dropping to become lower than an outer pressure thereof due to compression of air in the space when the substrate is cooled on the cooling plate; and
    wherein a pin path is formed in the cooling plate and is configured to accommodate lift pins;
    wherein the guide grooves and the pin path are not coextensive.

11. The cooling plate of claim 10, wherein a top surface of the cooling plate has a central region on which a substrate is loaded and an edge region surrounding the central region; and
    wherein the guide groove extends to an outer sidewall of the cooling plate from the central region.

12. The cooling plate of claim 10, having a central region on which a substrate is loaded and an edge region surrounding the central region,
    wherein through-holes are formed at the central region to penetrate the upper end of the central region to the lower end thereof; and
    wherein the guide groove is connected to the through-hole.

13. The cooling plate of claim 10, wherein the pin path includes pin holes formed at the cooling plate and lift pins that are movable through the pin holes to load a substrate on the cooling plate or lift up the substrate from the cooling plate while moving up and down; and
    wherein the guide grooves are connected to the pin holes.

14. The cooling plate of claim 13, having a central region on which a substrate is loaded and an edge region surrounding the central region,
    wherein the pin holes are disposed at a boundary between the central region and the edge region.

15. A substrate treating apparatus comprising:
    a plate on which a substrate is loaded;

wherein a pin path is formed in the plate and is configured to accommodate lift pins, the lift pins loading the substrate on the plate or lifting up the substrate from the plate, the lift pins moving up and down through pin holes formed in the plate, wherein a guide path is formed on the plate for guiding air in a space between the plate and the substrate to the exterior of the space when the substrate descends by means of the lift pins, the guide path being provided to a top surface of the guide path and having a guide groove extending to an outer sidewall of the plate from a central region thereof; and, wherein the guide path and the pin path are not coextensive.

16. The substrate treating apparatus of claim 15, wherein there are provided a plurality of guide grooves in a radial direction of the plate.

17. The substrate treating apparatus of claim 15, being a bake unit for heating or cooling a substrate.

18. The bake unit of claim 9, further comprising:

lift pins for loading a substrate on the plate or lifting the substrate from the plate while moving up and down, wherein pin holes are formed in the plate as moving paths of the lift pins, wherein the lift pins comprise:

a support surface for supporting the bottom edge of a substrate; and a guide surface opposed to a lateral part of a substrate placed on the support surface to prevent a substrate loaded on the lift pin from moving laterally; and wherein the guide groove is connected to the pin holes.

19. The bake unit of claim 9, further comprising:

lift pins for loading a substrate on the plate or lifting the substrate from the plate while moving up and down, wherein pin holes are formed in the plate as moving paths of the lift pins, wherein a top surface of the plate has a central region on which a substrate is loaded and an edge region surrounding the central region, wherein the guide path further comprises through-holes formed at the central region of the plate to penetrate from the upper end of the plate to the lower end thereof, wherein the guide groove is connected with the through-hole.

20. The bake unit of claim 9, wherein the plate is a cooling plate.

21. The bake unit of claim 9, wherein the guide path is formed at a top surface of the plate the guide path is formed for guiding exterior air to a space formed between the substrate and the plate when the substrate is loaded on the plate.

* * * * *